US008395265B2

United States Patent
Jin et al.

(10) Patent No.: US 8,395,265 B2
(45) Date of Patent: Mar. 12, 2013

(54) METAL SILICIDE NANOWIRES AND METHODS OF THEIR PRODUCTION

(75) Inventors: Song Jin, Madison, WI (US); Andrew L. Schmitt, Madison, WI (US); Yipu Song, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 52 days.

(21) Appl. No.: 12/829,665

(22) Filed: Jul. 2, 2010

(65) Prior Publication Data

US 2010/0279115 A1 Nov. 4, 2010

Related U.S. Application Data

(63) Continuation of application No. 11/506,147, filed on Aug. 17, 2006, now Pat. No. 7,803,707.

(51) Int. Cl.
*H01L 23/52* (2006.01)
(52) U.S. Cl. ......... 257/757; 257/E23.072; 257/E33.063; 977/762
(58) Field of Classification Search .............. 257/757, 257/768, E23.072, E33.063; 977/762, 890, 977/891
See application file for complete search history.

(56) References Cited

U.S. PATENT DOCUMENTS

2006/0046480 A1* 3/2006 Guo .............................. 438/685
2007/0105356 A1* 5/2007 Wu et al. ...................... 438/584

OTHER PUBLICATIONS

C.A. Decker et al "Directed growth of nickel silicide nanowires" Applied Physics Letters, vol. 84, No. 8, Feb. 23, 2004, pp. 1389-1391.*
Z.Y. Zhang et al, "Catalytic growth of alpha-FeSi2 and silicon nanowires", Journal of Crystal Growth, vol. 280, Jun. 15, 2005, pp. 287-291.*
Y.L. Chueh et al "Synthesis and charaterization of metallic TaSi2 nanowires" Applied Physics Letters, vol. 87 (Nov. 22, 2005), pp. 223113-1-223113-3.*

* cited by examiner

*Primary Examiner* — Caridad Everhart
(74) *Attorney, Agent, or Firm* — Bell & Manning, LLC

(57) ABSTRACT

The present invention provides metal silicide nanowires, including metallic, semiconducting, and ferromagnetic semiconducting transition metal silicide nanowires. The nanowires are grown using either chemical vapor deposition (CVD) or chemical vapor transport (CVT) on silicon substrates covered with a thin silicon oxide film, the oxide film desirably having a thickness of no greater than about 5 nm and, desirably, no more than about 2 nm (e.g., about 1-2 nm). The metal silicide nanowires and heterostructures made from the nanowires are well-suited for use in CMOS compatible wire-like electronic, photonic, and spintronic devices.

19 Claims, 3 Drawing Sheets

METAL SILICIDE NANOWIRES AND METHODS OF THEIR PRODUCTION

CROSS-REFERENCE TO RELATED APPLICATIONS

This application is a continuation of U.S. patent application Ser. No. 11/506,147, filed Aug. 17, 2006, which is incorporated by reference in its entirety.

FIELD OF THE INVENTION

The present invention relates generally to the field of metal silicide nanowires and metal silicide nanowire synthesis.

BACKGROUND OF THE INVENTION

As MOSFET devices are scaled down smaller and smaller in ultra large scale integration (ULSI) processes, all aspects of the MOSFET device structures, including semiconductor channels, source and drain electrical contacts, gate stacks, and interconnects, need to be scaled. Increasingly, the now famous Moore's law has also become applicable to novel materials. Very prominent among these novel materials are metal silicides. Metal silicides are already of paramount importance as integral parts of silicon microelectronics, mainly because of the low resistivity ohmic contact to CMOS transistors provided by metallic silicides such as NiSi, COSi$_2$, and TiSi$_2$ in the now dominant SALICIDE (Self-Aligned Silicides) process. In the last few years, metallic silicides, particularly nickel silicides (NiSi, Ni$_2$Si, Ni$_3$Si) have also been successfully explored in the FUSI (Full Silicidated Gate) process for the state-of-art MOSFET at 45 nm node, which is superior to the traditionally poly-silicon gates. Often overlooked is the fact that many silicides are direct bandgap semiconductors (e.g., β-FeSi$_2$, CrSi$_2$) that are promising for photonic applications as well, though a host of materials issues have prevented their application so far. Most significantly, the recent discovery of group IV ferromagnetic semiconductors, such as alloys of Fe$_x$Co$_{1-x}$Si, suddenly brings into sight the exciting prospects of silicon-based spintronics. Furthermore, because silicides are omnipresent at the interfaces between semiconductor (e.g., Si) and ferromagnetic metals (such as Fe), silicides inevitably dictate the success or failure of any silicon-based spintronic devices. Therefore, silicide materials are critically important both by choice and by necessity.

One the other hand, the tremendous progress witnessed over the last decade in one-dimensional nanomaterials such as carbon nanotubes and semiconductor nanowires has enabled a bottom-up paradigm of nanoscience and nanotechnology in which any kind of devices or functional systems can be assembled from the bottom-up using chemically synthesized nanoscale building blocks. Semiconductor nanowires have enjoyed prominent success, not only because these materials can exhibit diverse physical behavior and simultaneously function as the wires that access and interconnect devices, but also because they can be synthesized in single-crystalline form with precisely controlled (hetero)structures, diameters, lengths, chemical compositions and doping/electronic properties using a nanocluster catalyzed vapor-liquid-solid (VLS) growth process. Such high quality nanoscale building blocks have enabled the bottom-up assembly of many integrated electronic and photonic devices, including high performance nanometer scale field-effect transistors (FETs), light-emitting diodes, photodetectors, and lasers.

To date, there are few reports of the production of any silicides nanowires. Of these few reports, one report describes NiSi nanowires converted from silicon nanowires by reaction with an evaporated nickel film. See, Wu, et al., Nature, 430, 61 (2004). Other reports describe self-assembled epitaxial nanowires of rare earth silicides on vicinal silicon surfaces. See, Chen, et al., Appl. Phys. Leu., 76, 4004 (2000); and He et al., Phys. Rev. Lett., 93 (2004). The lack of reports is likely due to the fact that a general and rational chemical synthesis of these nanomaterials is challenging due to the complex phase behavior of silicides. For instance, there are five known iron silicide compound phases (Fe$_2$Si, Fe$_5$Si$_3$, FeSi, α-FeSi$_2$, and (β-FeSi$_2$) and four known chromium silicide compound phases (Cr$_3$Si, Cr$_5$Si$_3$, CrSi, CrSi$_2$).

Rational synthesis of nanowires usually has two main challenges: the anisotropic crystal growth to form 1-D nanostructures and the delivery of source materials. The most successful technique for metal nanowire growth may be the metal-catalyzed vapor-liquid-solid (VLS) technique which uses metallic nanoparticles that form low temperature eutectics with the nanowire material via chemical vapor deposition (CVD). Unfortunately, this technique is not suited for growing a wide range of metal nanowires and produces nanowires that are contaminated with metal catalyst impurities and catalyst "tips"

SUMMARY OF THE INVENTION

The present invention provides metal silicide nanowires, including metallic, semiconducting and ferromagnetic transition metal silicide nanowires, and methods for their production. The metal silicide nanowires and heterostructures made from the nanowires are well-suited for use in CMOS compatible wire-like electronic, photonic, and spintronics devices.

The present methods provide a general synthetic approach for the production of single crystalline metal silicide nanowires. In one method, free-standing, single crystal, metal silicide nanowires are grown on a thin (e.g., 1-2 nm thick) silicon oxide film over an underlying silicon substrate via a chemical vapor deposition (CVD) process using single source or multiple (e.g., double) source precursors. In another method, free-standing single crystal, metal silicide nanowires are grown on the thin silicon oxide film via a chemical vapor transport (CVT) process using solid metal silicide precursors. The CVT process may be employed for the growth of transition metal silicides for which organometallic precursors are not readily available.

The nanowire growth mechanisms provided herein are different from the well known vapor-liquid-solid (VLS) growth mechanism, due to the absence of metal catalysts. As a result, the metal nanowires are free from metal catalyst impurities and lack the catalyst caps or tips that are characteristic of VLS-grown nanowires.

Potential applications for the metal silicide nanowires include, but are not limited to, extremely small and low resistivity silicide gate lines to nanowire or traditional MOSFET devices, integrated ohmic contacts and low resistivity interconnects for nanoelectronics, highly efficient, highly stable, and CMOS compatible field emission tips for vacuum electronics and field emission displays, nanophotonic devices based on semiconducting silicide nanowires, and finally, nanospintronic devices based on ferromagnetic semiconducting silicide nanowires.

Further objects, features and advantages of the invention will be apparent from the following detailed description.

DETAILED DESCRIPTION OF THE INVENTION

Figure 1:
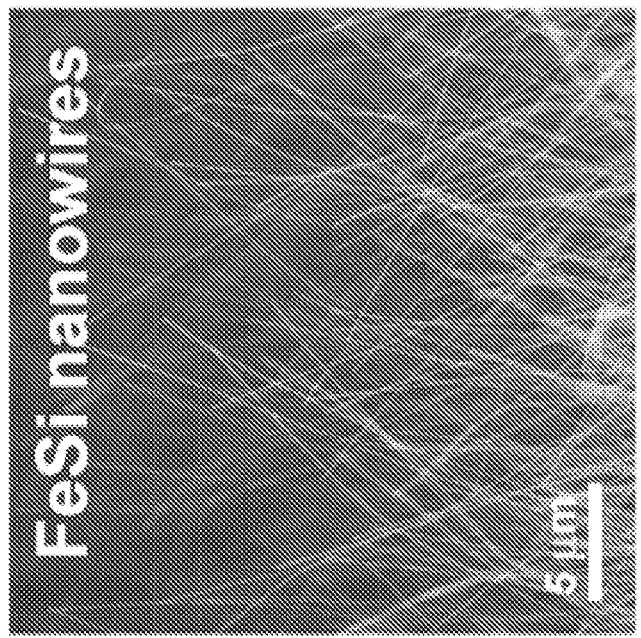
FIG. 1 illustrates a method of producing FeSi nanowires in accordance with the present invention.
Figure 1:
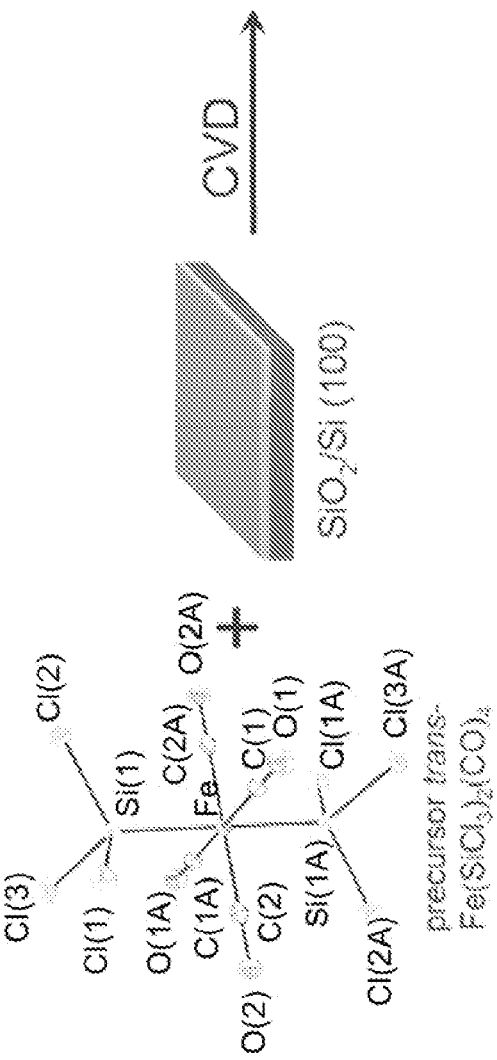

The present invention provides metal silicide nanowires, including metallic semiconducting and ferromagnetic semiconducting transition metal silicide nanowires. The nanowires are grown using either CVD or CVT growth on silicon substrates covered with a thin silicon oxide film, the oxide film desirably having a thickness of no greater than about 5 nm and, desirably, no more than about 2 nm (e.g., about 1-2 nm).

The present invention is based, at least in part, on the inventor's discovery that by carefully controlling the thickness of a silicon oxide film on a silicon growth substrate surface, metal silicide nanowires may be grown, whereas the same nanowires could not be grown on thicker oxide layers. The thin oxide film may be produced using any method suitable for providing a film of the desired thickness. For example, a thin oxide layer may be produced by exposing a silicon substrate (that has been etched with HF to remove any existing native oxide) to ambient air at room temperature for 7-10 days. Exposure to short (254 nm) ultra-violet UV light in air can shorten the oxidation time to about 45-90 mins. Alternatively, the thin oxide film may be produced using a metal etch solution. (See Examples below for more detail.)

Because the present methods provide nanowire growth on silicon surfaces when a thin silicon oxide layer is present, but not on areas of the same surface when a thicker silicon oxide layer is present, the present methods may be used to grow nanowires in patterns on a substrate surface. Briefly, lithography techniques can be used to pattern areas of thin layers of silicon oxide (e.g., $\leq 2$ nm) and areas of thick layers of silicon oxide (e.g., $\geq 10$, $\geq 50$, $\geq 100$) on a silicon substrate and nanowires may then be selectively grown on the areas covered in the thin layer of silicon oxide. This is illustrated in more detail in Example 6, below.

No metallic catalyst particles or films are employed by the present methods for nanowire growth. Thus, catalyst caps or tips, which are the characteristics of the VLS growth mechanism, are not produced. In fact, when potential metal catalysts such as Fe, Ni, Cu, Au, Ag, were intentionally introduced to the growth by employing silicon substrates that were coated with evaporated thin films (Fe, Ni, Cu) or colloids (Cu, Au, Ag), no nanowire growth was observed. Without wishing or intending to be bound by any particular theory of the invention, the inventors believe that a mechanism involving non-metallic materials as catalysts, such as silicon or silicon oxides, may be responsible for nanowire growth. Alternatively, it might be a "self-seeded" growth type mechanism. Sometimes, a very small amount of growth promoting compound may be deposited on the $SiO_2$ layer prior to nanowire growth to promote nanowire synthesis. $Ni(NO_3)_2$ is one example of such a compound.

In the methods that employ a chemical vapor transport (CVT) growth mechanism, nanowires are grown on a thin $SiO_2$ layer by heating solid precursors (e.g., metal silicide powder) and an appropriate transport agent (e.g., $I_2$) under a suitable temperature gradient set-up between the solid precursors and nanowire growth substrates that are covered by the thin silicon oxide layer. Reversible reactions between the solid silicide precursors and the transport agents produce gaseous compounds containing both metal elements and silicon to provide the precursors needed for nanowire growth.

In methods that employ a CVD growth mechanism, nanowires are grown on silicon substrates covered with a thin $SiO_2$ layer by exposing gas-phase metal silicide precursor molecules to the silicon oxide layer. The precursors may be single source precursors, where a single precursor is an organometallic molecule that includes both the metal and silicon atoms from which the nanowires are built. The use of single source precursors enables low temperature delivery of both the silicon and metal elements in precise stoichiometry to the substrate using simple and safe experimental set-up, providing good control of the reaction and high quality nanowire growth. Alternatively, the precursors may be multiple source precursors, where the metal and silicon atoms are contained in two or more different precursor molecules that are to be delivered in the correct ratio to produce the desired metal silicide nanowires.

Metal silicide nanowires that may be produced using the present methods include nanowires comprising transition metal silicide nanowires and, in particular, metallic, semiconducting, and ferromagnetic semiconducting transition metal silicide nanowires. Because the mechanism for nanowire growth is generally applicable to transition metal silicides, any transition metal silicide nanowire could be produced using one or more of the present methods by employing the appropriate precursors. The nanowires may be composed of a single metal silicide or a combination of two or more metal silicides. Specific examples of metal silicide nanowires that may be produced in accordance with the present methods include, but are not limited to, nanowires composed of iron silicides (e.g., FeSi and ($\beta$-$FeSi_2$), cobalt silicides (e.g., CoSi and $CoSi_2$), titanium silicides (e.g., $TiSi_2$), chromium silicides (e.g., $CrSi_2$ and $Cr_5Si_3$), nickel silicides (e.g., NiSi, $Ni_2Si$, $NiSi_2$, and $Ni_3Si$), manganese silicides (e.g., MnSi and $MnSi_{1.8}$), platinum silicides (e.g., PtSi), palladium silicides (e.g., $Pd_2Si$), molybdenum silicides (e.g., $MoSi_2$ and $Mo_5Si_3$), tungsten silicides (e.g., $WSi_2$ and $W_5Si_3$), ruthenium silicides (e.g., $Ru_2Si_3$), vanadium silicides (e.g., $V_3Si$ and $VSi_2$), niobium silicides (e.g., $NbSi_2$), tantalum silicides (e.g., $TaSi_2$), rhenium silicides (e.g., $ReSi_{1.8}$), iridium silicides (e.g., IrSi), rhodium silicides (e.g., RhSi), and combinations thereof (e.g., $Fe_xCO_{1-x}Si$ and $Fe_xMn_{1-x}Si$).

In general, the present methods produce smooth, straight nanowires with a relatively uniform size distribution. Nanowires made with the present methods typically have diameters of no more than about 100 nm and lengths of tens of microns, in some cases (e.g., $Ni_2Si$), lengths of hundreds of microns, or even millimeters, have been achieved. Thus, a typical collection of nanowires made in a single synthesis might have an average diameter of no more than about 100 nm and will include nanowires having lengths of at least 20 p.m. This includes collections of nanowires having an average diameter of no more than about 50 nm and further includes collections of nanowires having an average diameter of no more than about 20 nm. Some syntheses produce a collection of nanowires having a distribution of diameters that varies by no more than ±10 nm.

By using silicon substrates covered with thinner oxide films, more complex nanostructures having secondary growth nanowires, nanorods or nanocrystals extending outwardly from their main nanowire stem may be produced. This is illustrated in Example 2, below.

Many suitable single and double source precursors for use in the production of the metal silicide nanowires using a CVD process are known and some are commercially available. Carbonyl-silyl organometallics are a preferred class of precursors; however, other precursors may be employed. The following discussion provides a non-limiting list of some suitable precursors for a variety of metal silicide nanowires.

A suitable single source precursor for the production of nanowires comprising iron silicides (e.g., FeSi or ($\beta$-FeSi$_2$) is Fe(SiCl$_3$)$_2$(CO)$_4$. Methods for producing this precursor may be found in Novak et al., *Organometallics*, 16, 1567 (1997). Suitable double source precursors for the production of nanowires comprising iron silicides include Fe(CO)$_5$ or FeCl$_3$ and SiCl$_4$ or other chlorosilanes.

A suitable single source precursor for the production of nanowires comprising cobalt silicides (e.g., CoSi or CoSi$_2$) is Co(SiCl$_3$)(CO)$_4$. Methods for producing this precursor may be found in Novak et al., *Organometallics*, 16, 1567 (1997). Suitable double source precursors for the production of nanowires comprising cobalt silicides include CO$_2$(CO)$_8$, Co(NO)(CO)$_4$, CoCl$_2$ and SiCl$_4$ or other chlorosilanes.

Suitable double source precursors for the production of nanowires comprising titanium silicides (e.g., TiSi$_2$) include TiCl$_4$ and SiCl$_4$ or other chlorosilanes.

A suitable single source precursor for the production of nanowires comprising chromium silicides (e.g., CrSi$_2$) is Cr(SiCl$_3$)(CO)H(C$_5$H$_5$). Methods for producing this precursor may be found in Jetz, et al., *J. Am. Chem. Soc.* 91, 3375 (1969). Suitable double source precursors for the production of nanowires comprising chromium silicides include Cr(CO)$_6$, CoCl$_3$ and SiCl$_4$ or other chlorosilanes.

A suitable single source precursor for the production of nanowires comprising manganese silicides (e.g., MnSi) is Mn(SiCl$_3$)(CO)$_4$. Methods for producing this precursor may be found in Jetz, et al, *J. Am. Chem. Soc.* 89, 2773 (1967). Suitable double source precursors for the production of nanowires comprising manganese silicides include MnCl$_2$ and SiCl$_4$ or other chlorosilanes.

A suitable single source precursor for the production of nanowires comprising nickel silicides (e.g. NiSi) is Ni(SiCl$_3$)$_2$(CO)$_3$. Methods for producing this precursor may be found in Janikowshi, et al, *Organometallics*, 4, 396 (1985) or Jetz, et al, *J. Am. Chem. Soc.*, 89, 2773 (1967). Suitable double source precursors for the production of nanowires comprising nickel silicides include NiCl$_2$ and SiCl$_4$ or other chlorosilanes.

A suitable single source precursor for the production of nanowires comprising molybdenum silicides (e.g. MoSi$_2$) is Mo(SiCl$_3$)(CO)$_3$(C$_5$H$_5$). Methods for producing this precursor may be found in Jetz, et al, *J. Am. Chem. Soc.*, 89, 2773 (1967). Suitable double source precursors for the production of nanowires comprising molybdenum silicides include MoCl$_5$, Mo(CO)$_6$ and SiCl$_4$ or other chlorosilanes.

Suitable double source precursors for the production of nanowires comprising tungsten silicides (e.g., WSi$_2$) include WCl$_6$, WF$_6$ or W(CO)$_6$ and SiCl$_4$ or other chlorosilanes.

Suitable double source precursors for the production of nanowires comprising tantalum silicides (e.g., TaSi$_2$) include TaCl$_5$ and SiCl$_4$ or other chlorosilanes.

Suitable single source precursors for the production of nanowires comprising ruthenium silicides (e.g., Ru$_2$Si$_3$) include Ru(CO)$_4$(SiMe$_2$CH$_2$CH$_2$SiMe$_2$) and Ru(SiCl$_3$)$_2$(CO)$_4$. Methods for producing these precursors may be found Vancea, et al. *Inorganic Chemistry*, 13,511 (1974).

The present methods may also be used to produce doped nanowires (or nanowires that include more than one metal element) by using a combination of the above precursors simultaneously, in the appropriate ratio. For instance, Fe(SiCl$_3$)$_2$(CO)$_4$ and Co(SiCl$_3$)(CO)$_4$ may be used together in CVD synthesis to produce ferromagnetic semiconducting Fe$_x$Co$_{1-x}$Si nanowires.

The general bottom-up synthetic approach to the production of metal silicide nanowires, including the ability to produce branched structures, is well-suited for the production of heterostructures of the type used in spintronic and photonic interconnects. In particular, the present methods may be used to form epitaxial heterojunctions between metal silicide nanowires and silicon nanowires, since most silicides have heteroepitaxial relationships with various silicon surfaces, for examples, (0001) CrSi$_2$ with Si(111), (100)FeSi with Si(100), and (101)$\beta$-FeSi$_2$ with Si(111). In previous attempts at incorporating thin films of silicides using molecular beam epitaxy or ion implantations, islanding, phase separations, and extensive defects occur on large planar surfaces. By following the bottom-up assembly of the present methods, these problems are bypassed by directly and selectively synthesizing from the bottom-up high quality single crystalline epitaxial silicides and integrating them into device components.

Heterojunctions between the metal silicide nanowires and other nanowires, such as semiconducting nanowires, may be fabricated by using the metal silicide nanowires as a substrate or catalyst for growth of the other nanowire. For example, a silicon nanowire can be grown from the end of, or along the length of, a metal silicide nanowire by using the silicide nanowire as a catalyst in a VLS growth mechanism. Many silicides with high silicon content, such as FeSi and CrSi$_2$, form eutectics with silicon, which makes them suitable VLS catalysts for growing silicon nanowires. Alternatively, heterojunctions may be formed by depositing a thin layer of silicon oxide on a pre-fabricated nanowire (e.g., a silicon nanowire grown by the VLS technique) and growing one or more metal silicide nanowires on the thin silicon oxide layer using the methods disclosed herein.

Using the methods described herein, semiconducting (e.g., $\beta$-FeSi$_2$ (bandgap 0.80 eV) and CrSi$_2$ (bandgap 0.35 eV)) nanowires having axial epitaxial heterostructures with silicon for use in nanophotonic devices such as LED and IR detectors may be fabricated. For example, heterostructures such as p-$\beta$-FeSi$_2$-n-Si or p-Si-$\beta$-FeSi$_2$-n$^+$-Si, can be used to make efficient electroluminescent devices or IR photodetectors at room temperature. CrSi$_2$ can be substituted for the $\beta$-FeSi$_2$ in these structures using a different epitaxial relationship.

Using a controlled secondary nanowire growth process branched structures with heterojunctions at the branching points may be fabricated for use in nanoelectronic, photonic, and spintronics devices. Such structures may be made as both Si-branch-silicide and silicide-branch-silicon structures, and even more complex combination of both. These chemically synthesized nanostructures can serve as nanoscale devices fully integrated with silicide gates and/or ohmic contact and/or interconnects.

EXAMPLES

Example 1

Unbranched FeSi Nanowires

Precursor Formation: The metal carbonyl-silyl organometallic single source precursor, Fe(SiCl$_3$)$_2$(CO)$_4$ was synthesized from Fe$_3$(CO)$_{12}$ and SiHCl$_3$ following a procedure modified from Novak et al., *Organometallics*, 16, 1567 (1997), the entire disclosure of which is incorporated herein by reference. Briefly, SiHCl$_3$ (Aldrich, ca. 10 mL, 99 mmol) and Fe$_3$(CO)$_{12}$ (Aldirch, 0.998 g, 1.98 mmol) were loaded into a thick-walled glass tube equipped with a Teflon valve and pumped down to 0.5 Torr. The sealed vessel was then heated at 120° C. under stirring for 2 days during which the color of the solution turned from green to orange within the first hour. Warning: Heating volatile liquid reaction mixture that generates gas in close containers can cause pressure built up and potential explosion! After cooling, the reaction mixture was transferred to a sublimation apparatus in a nitrogen filled glove box. Excess $SiHCl_3$ was removed under dynamic vacuum and the resulting solid was sublimed at 80° C. and 0.3 Torr for 2 hours before the product was collected from the cold finger of the sublimation apparatus inside the glove box. The final yellow solid product weighed 1.542 g (59% yield). IR (KBr pellet): 2076 (s), 2070 (s) 2039 (m), 2130 (w) $cm^{-1}$. The product was spectroscopically identified and structurally characterized to be trans-$Fe(SiCl_3)_2(CO)_4$.

Nanowire Formation: All nanowire synthesis experiments were carried out in a homebuilt CVD setup comprised of a quartz tube heated by a tube furnace and equipped with pressure and gas flow controls. The $Fe(SiCl_3)_2(CO)_4$ was placed close to the upstream entrance to the furnace at about 150° C., sublimed, and carried downstream by a flow of 150 sccm argon. Silicon substrates with thin layers of $SiO_2$ on their surfaces were placed in the hot zone and nanowire growth was carried out at 750° C. and 200 Torr for 20-25 mins. The substrates were prepared by exposing HF etched silicon substrates in ambient air at room temperature for 7-10 mins, or in a "metal etch" solution (30% $H_2O_2$: 37% HCl: $H_2O$=1:1:5 v/v) at 70° C. for 10-20 mins FIG. 1 illustrates the process of FeSi nanowire formation and includes an SEM image of the FeSi nanowires.

Nanowire Characterization: Representative scanning electron microscopy (SEM) images revealed smooth and straight nanowires of 10-80 nm in diameter and tens of micrometers in length produced in high yield. Uniform nanowire diameter distributions (±10 nm) were observed within each synthesis. FIG. 1 illustrates the process of FeSi nanowire formation and includes an SEM image of the FeSi nanowires.

All of the major peaks in the powder X-ray diffraction (PXRD) pattern of the samples of grown nanowires can be indexed to the cubic FeSi structure. High-resolution transmission electron microscopy (HRTEM) confirmed that the nanowires were single-crystalline FeSi nanowires. FeSi has a simple cubic structure with a lattice constant of 4.488 Å. Lattice fringes were clearly seen for the HRTEM images of two representative nanowires with widths of 19 nm and 25 nm in the [001] and [Ī 10] zone axes, respectively. The observed lattice spacings were found to be 4.48 Å, 3.16 Å, 2.59 Å; corresponding well to the (100) (4.488 Å), (110) (3.174 Å), and (111) (2.591 Å) lattice spacings of the FeSi structure, respectively. The two-dimensional Fast Fourier transform (FFT) of the lattice resolved images showed the reciprocal lattice peaks, which can be indexed to a simple cubic lattice with a lattice constant a=4.48 Å. All indexed reciprocal lattices observed showed that the nanowire axes were parallel to the <110> crystal directions.

Example 2

Branched FeSi Nanowires

Nanowire Formation: FeSi nanowires were produced using the CVD method described in Example 1, except that the oxide layers on the silicon substrates were reduced. To produce the silicon oxide coated substrates, all of the substrates were first etch with HF to remove native oxide and then: 1) exposed to a "metal etch" solution (30% $H_2O_2$: 37% HCl: $H_2O$=1:1:5 v/v) at 70° C. for 3 or 7 minutes; 2) exposed to ambient air at room temperature for 1 day followed by vacuum annealing at 500° C. for 30 min; or 3) exposed to ambient air at room temperature for 4 days.

Figure 2:
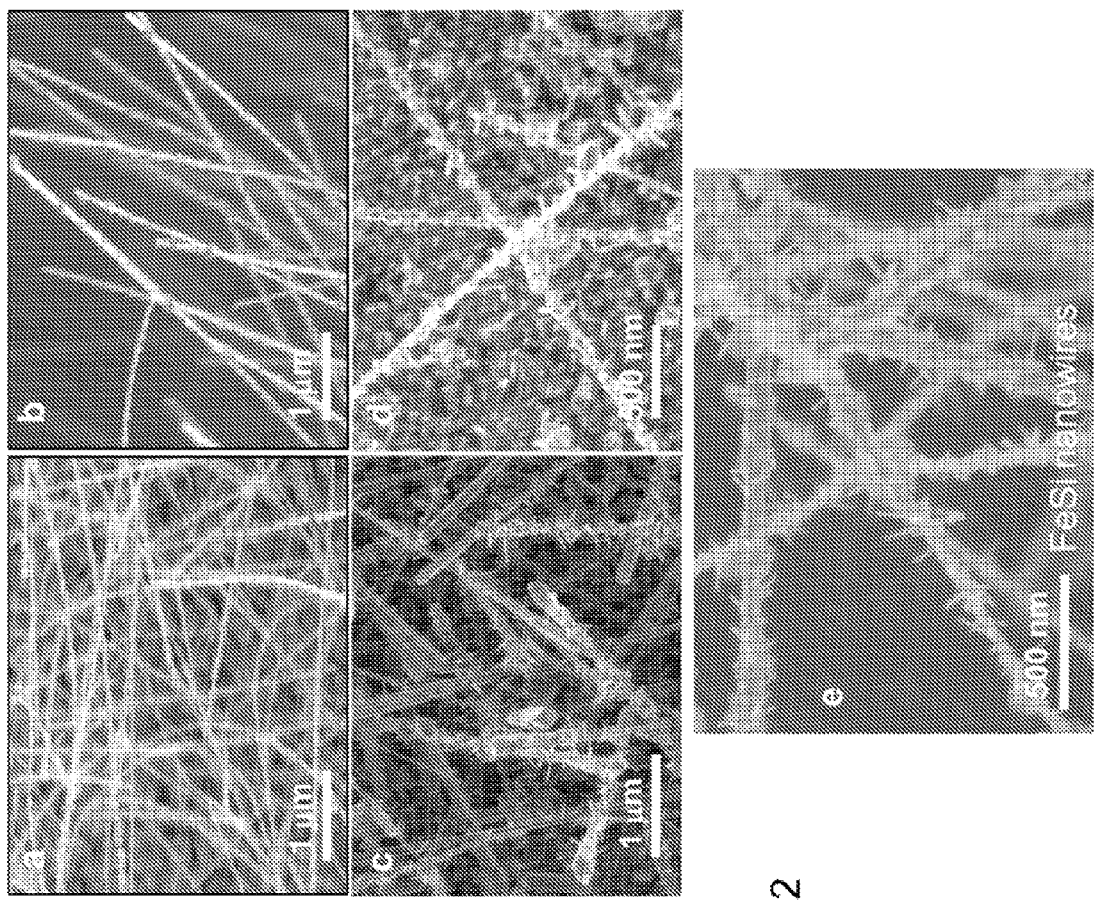
FIG. 2 shows SEM images of nanowires having secondary structures branching from their surfaces.

Nanowire Characterization: SEM images of the nanowires showed that the nanowires were branched with secondary nanowires or nanorods extending outwardly along the length of the main nanowire. The secondary structures are shown in FIG. 2, which shows SEM images of the nanowires grown on a silicon substrate that was teched with HF and then: (a) exposed to the metal etch solution for 3 min.; (b) exposed to the metal etch solution for 7 min; (c) exposed to ambient air at room temperature for 1 day, followed by annealing at 500° C. for 30 min.; and (d) exposed to ambient air at room temperature for 4 days. Panel (e) in FIG. 2 shows an enlarged view of a portion of panel (d). This illustrates the critical dependence of silicon oxide film thickness on nanowire growth characteristics.

Example 3

CoSi Nanowires

Precursor Formation: In a typical synthesis of the metal carbonyl-sylil organometallic single source precursor, $Co(SiCl_3)(CO)_4$, approximately 15 ml of $SiHCl_3$ was added to 3.04 g of dry $Co_2(CO)_8$ placed in a Carius tube and cooled to −40° C. in an acetonitrile/dry ice slurry. The reaction tube was pumped down to 0.5 Torr, sealed and stirred at −40° C. for 2 hours before warming to room temperature. The reaction mixture was transferred to a sublimation apparatus in a glove box and the remaining $SiHCl_3$ was removed with dynamic vacuum before sublimation at 40° C. and 0.1 Torr was carried out for 2 hours. The final product of yellow crystals collected on the cold finger weighed 3.65 g (a 68% yield). Sublimed crystals were suitable for single crystal X-ray diffraction study, which revealed identical cell parameters to those previously reported.

Nanowire Formation: CoSi nanowire formation was carried out using the equipment and procedure of Example 1, above, with the exception that the $Co(SiCl_3)(CO)_4$ precursor was placed in a cooler part of the tube (at about 100° C.) and smaller argon flow rate of 100 sccm was used.

Nanowire Characterization: The chemical structure and the single crystalline nature of the resulting nanowires were confirmed using powder X-ray diffraction (PXRD) and high-resolution transmission electron microscopy (HRTEM) of the nanowires. All major diffraction peaks were indexed to cubic CoSi structure (JCPDS PDF00-008-362), which belongs to the FeSi structure type (Space group $P2_13$, Person symbol cP8, Z=4) with lattice constant of 4.43 Å. HRTEM images revealed cubic CoSi lattice fringes for a representative CoSi nanowire along the [100] zone axis and the corresponding fast fourier transformation (FFT) can be successfully indexed to a simple cubic lattice. The observed lattice spacing of 4.45 Å for CoSi nanowires matches well with the reported value of 4.43 Å. All nanowires observed under TEM are single-crystalline CoSi structures. All nanowires axis observed using TEM were parallel to the <110> crystal directions.

Example 4

$CrSi_2$ Nanowires

Nanowire Formation: Si(100) substrates were etched in a 5% HF solution for 10 minutes, followed by oxidation in a "metal etch" solution (30% $H_2O_2$: 37% HCl: $H_2O$=1:1:5 v/v) at 70° C. for 10 minutes, then rinsed in DI water and dried in a stream of nitrogen gas. A drop of 0.02 M solution of $Ni(NO_3)_2$ in ethanol was spread on a substrate and allowed to air dry.

$CrSi_2$ nanowires were synthesized in a custom-built chemical vapor transport setup, using a tube furnace and 22 mm quartz tubes. $CrSi_2$ powder in an alumina boat was placed at the center of the tube furnace, iodine crystals in an alumina boat was placed upstream just outside of the tube furnace, and the oxidized silicon substrate was placed downstream in the heating zone of the furnace. The furnace was heated to 900° C. (temperature at the center) for 2.5 hours with an Ar flow rate of 15 sccm and atmospheric pressure. Nanowire growth was observed for substrates located in the temperature range of 730-830° C., with increased amount of growth at the higher end of this temperature range.

Nanowire Characterization: Representative scanning electron microscopy (SEM) images revealed smooth and straight nanowires of 20-150 nm in diameter and tens of micrometers in lengths produced in high yield.

All of the diffraction peaks in the powder X-ray diffraction (PXRD) pattern of the samples of grown nanowires can be indexed to the hexagonal $CrSi_2$ structure. High-resolution transmission electron microscopy (HRTEM) confirms that these were single-crystal $CrSi_2$ nanowires. $CrSi_2$ has a hexagonal structure with the lattice constants of a=4.4283 Å and c=6.3680 Å (Space group P6$_2$22, Pearson symbol hP9, structure type $CrSi_2$, Z=3, JCPDS 35-781). Lattice fringes were clearly seen for the HRTEM images of a representative NW with the [110] zone axis. The observed lattice spacings were found to be 6.37 Å, 2.11 Å, and 2.23 Å, which correspond well with the (00$\bar{1}$) (6.368 Å), (1 $\bar{1}$1) (2.091 Å), and (1 $\bar{1}$0) (2.214 Å) lattices spacing of the $CrSi_2$ structure respectively. The two dimensional Fast Fourier Transform (FFT) of the lattice resolved image showed the reciprocal lattice peaks that can be indexed to a hexagonal lattice with a lattice constant of a=4.43 Å and c=6.37 Å. The indexed reciprocal lattice observed showed that the nanowire axis is parallel to the <001> direction.

Example 5

$Ni_2Si$ Nanowires

Nanowire Formation: In a chemical vapor transport setup comprised of a quartz tube placed in a tube furnace, iodine powder was placed at the upstream outside of the furnace, $Ni_2Si$ powder in an alumina boat was placed in the center of a tube furnace, and $Si/SiO_2$ substrates, on which several drops of 0.1 M $Ni(NO_3)_2$ solution in water has been dispersed and air dried, was placed downstream in the heating zone. The furnace was heated to 1000° C. (temperature at the center) for 4 hours with an Ar flow rate of 20 sccm and an atmospheric pressure. Best nanowire growth was observed for substrates located in the temperature range of 820-870° C.

Nanowire Characterization: Representative scanning electron microscopy (SEM) images revealed smooth and straight nanowires of 10-100 nm in diameter and hundreds of micrometers in lengths produced in high yield. Uniform nanowire diameter distributions (±10 nm) were observed within each synthesis.

All of the diffraction peaks in the powder X-ray diffraction (PXRD) pattern of the samples of grown nanowires can be indexed to the orthorhombic $Ni_2Si$ structure. High-resolution transmission electron microscopy (HRTEM) confirmed that the nanowires were single-crystalline $Ni_2Si$ nanowires. $Ni_2Si$ has an orthorhombic structure (lattice parameters: a=4.99 Å, b=3.72 Å, c=7.06 Å; Space group Pcmn; Person symbol oP12). The measured lattice spacing observed in HRTEM is 3.764 Å, corresponding well to the (010) lattice spacings of the $Ni_2Si$ structure. The two-dimensional Fast Fourier transform (FFT) of the lattice resolved images showed the reciprocal lattice peaks, which can be indexed to an orthorhombic structure lattice. The indexed reciprocal lattices observed showed that the nanowire growth axis is parallel to the <010> crystal directions.

Example 6

Patterned Growth of FeSi Nanowires on a Silicon Substrate

Figure 3:
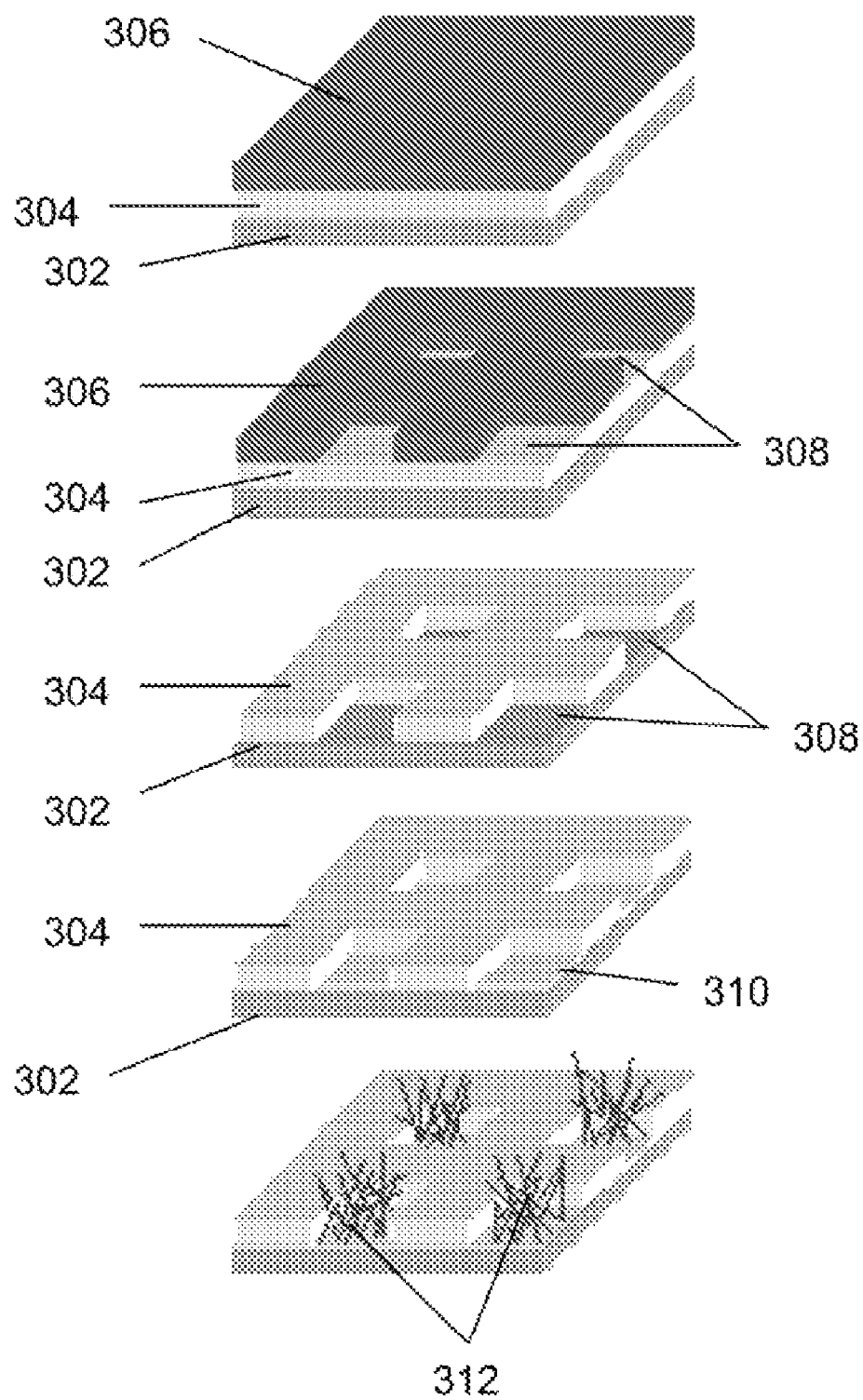
FIG. 3 illustrates a method for patterning the growth of nanowires on a silicon substrate.

This example illustrates the patterned growth of FeSi nanowires on a silicon substrate. The method for patterned growth is illustrated schematically in FIG. 3. Trenches or mounds were patterned into a silicon substrate 302 including a layer of 100 nm $SiO_2$ 304 on Si. Using standard photolithography methods with a photoresist 306 regions where nanowire growth was desired 308 were exposed, then developed. $SiO_2$ was removed in these regions by a 65-70 second exposure to a buffered HF (6:1, $NH_4F$:HF) etchant. A thin layer of $SiO_2$ 310 was then regrown onto the exposed regions by oxidizing the surface with an acidic solution ($H_2O$:HCl:$H_2O_2$, 5:1:1) for 10 minutes at 70° C. The effectiveness of this substrate treatment was confirmed through optical microscopy and atomic force microscopy (AFM) imaging of the substrates after their preparation was complete. Silicon diffracts light differently depending on the thickness of $SiO_2$ on the surface, and it is therefore easy to visually check for large thickness differences in optical images.

Catalyst-free patterned nanowire growth followed from the chemical vapor deposition (CVD) of trans-$Fe(SiCl_3)_2(CO)_4$ onto the prepared substrates. The CVD was performed in a homebuilt setup where reaction conditions are controlled by a tube furnace (750° C.), mass flow control of Ar (150 sccm), and a pressure-gauge and feedback valve (200 Torr). In this way nanowire growth can be patterned as desired depending on the mask employed.

Nanowires 312 grew only out of the defined trenches 308 with random orientations coming from the surface. If a higher degree of vertical alignment is desired, thicker oxides along with narrow wells may be employed.

Using standard photolithography feature sizes of about 1-2 µm were defined. However, for feature sizes of 4 µm and above, it may be desirable to minimize the oxidation in the thin oxide layers, since the oxide layer thickness may be increased by the natural mobility of the $SiO_2$. In addition, it may be desirable to use vapor-based oxidation methods like plasma treatment or UV irradiation to oxidize the surface in order to offset the silicon hydrophobicity which may inhibit oxide growth.

For the purposes of this disclosure and unless otherwise specified, "a" or "an" means "one or more". All patents, applications, references and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

It should be understood that the invention is not limited to the embodiments set forth herein as illustrative, but embraces all such forms thereof as come within the scope of the following claims.

What is claimed is:

1. A metal silicide nanowire having an average diameter of no more than about 100 nm and a length of at least 200 nm, wherein the nanowire is free-standing in that it is not supported along its length by a substrate, and further wherein the nanowire comprises two or more metal elements.

2. The nanowire of claim 1, comprising iron and cobalt.

3. The nanowire of claim 1, wherein the nanowire is free of metal catalyst impurities.

4. The nanowire of claim 1, having a length of at least 20 μm.

5. The nanowire of claim 1, wherein the nanowire is a single crystal nanowire.

6. The nanowire of claim 1, comprising iron and manganese.

7. The nanowire of claim 1, wherein the two or more metal elements provide two or more metal silicides.

8. A metal silicide nanowire having an average diameter of no more than about 100 nm and a length of at least 200 nm, wherein the nanowire is free-standing in that it is not supported along its length by a substrate, further wherein the nanowire lacks a catalyst cap or tip, and further wherein the nanowire comprises β-FeSi$_2$ or FeSi.

9. The nanowire of claim 8, comprising β-FeSi$_2$.

10. The nanowire of claim 8, wherein the nanowire is free of metal catalyst impurities.

11. The nanowire of claim 8, having a length of at least 20 μm.

12. The nanowire of claim 8, wherein the nanowire is a single crystal nanowire.

13. The nanowire of claim 8, comprising FeSi.

14. A metal silicide nanowire having an average diameter of no more than about 100 nm and a length of at least 200 nm, wherein the nanowire is free-standing in that it is not supported along its length by a substrate, and further wherein the metal silicide is a cobalt silicide.

15. The nanowire of claim 14, wherein the metal silicide is CoSi.

16. A metal silicide nanowire having an average diameter of no more than about 100 nm and a length of at least 200 nm, wherein the nanowire is free-standing in that it is not supported along its length by a substrate, and further wherein the metal silicide is a chromium silicide.

17. The nanowire of claim 16, wherein the metal silicide is CrSi$_2$.

18. A metal silicide nanowire having an average diameter of no more than about 100 nm and a length of at least 200 nm, wherein the nanowire is free-standing in that it is not supported along its length by a substrate, and further wherein the metal silicide is β-FeSi$_2$.

19. A metal silicide nanowire having an average diameter of no more than about 100 nm and a length of at least 200 nm, wherein the nanowire is free-standing in that it is not supported along its length by a substrate, and further wherein the metal silicide is FeSi.

* * * * *